United States Patent
Nakano et al.

(10) Patent No.: US 10,962,660 B2
(45) Date of Patent: Mar. 30, 2021

(54) ACTIVE MATRIX SUBSTRATE, AND X-RAY IMAGING PANEL

(71) Applicant: SHARP KABUSHIKI KAISHA, Sakai (JP)

(72) Inventors: Fumiki Nakano, Sakai (JP); Makoto Nakazawa, Sakai (JP); Hiroyuki Moriwaki, Sakai (JP); Rikiya Takita, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 91 days.

(21) Appl. No.: 16/539,199

(22) Filed: Aug. 13, 2019

(65) Prior Publication Data
US 2020/0057169 A1    Feb. 20, 2020

Related U.S. Application Data

(60) Provisional application No. 62/719,784, filed on Aug. 20, 2018.

(51) Int. Cl.
| | |
|---|---|
| *G01T 1/24* | (2006.01) |
| *G01T 1/20* | (2006.01) |
| *H01L 27/146* | (2006.01) |
| *G01T 1/29* | (2006.01) |

(52) U.S. Cl.
CPC ............ *G01T 1/244* (2013.01); *G01T 1/2018* (2013.01); *G01T 1/246* (2013.01); *G01T 1/2928* (2013.01); *H01L 27/14663* (2013.01)

(58) Field of Classification Search
CPC . H01L 27/14663; G01T 1/2018; G01T 1/244; G01T 1/246; G01T 1/2928
See application file for complete search history.

(56) References Cited

U.S. PATENT DOCUMENTS

| | | | |
|---|---|---|---|
| 10,700,146 B2 * | 6/2020 | Chai | ............ H01L 27/32 |
| 2009/0236496 A1 | 9/2009 | Tanada et al. | |

FOREIGN PATENT DOCUMENTS

| | | | | |
|---|---|---|---|---|
| JP | 2009260305 A | * | 1/2009 | ......... H01L 31/101 |
| JP | 2009-260305 A | | 11/2009 | |

* cited by examiner

*Primary Examiner* — David P Porta
*Assistant Examiner* — Fani Boosalis
(74) *Attorney, Agent, or Firm* — ScienBiziP, P.C.

(57) ABSTRACT

An active matrix substrate includes a photoelectric conversion element in a pixel P defined by a gate line and a data line. The photoelectric conversion element is connected with a bias line, and the bias line is connected with a bias terminal that supplies a bias voltage to the bias line. The bias terminal is connected with a first protection circuit that is formed with a nonlinear element. The first protection circuit is connected in a reverse-biased state between a first line to which a predetermined voltage higher than the bias voltage is supplied, and the bias terminal.

9 Claims, 10 Drawing Sheets ly known. JP-A-2009-260305 discloses a photo IC that includes a light receiving element, an integrated circuit including a plurality of transistors, and a protection diode. As a protection diode, a photodiode is used, and each of the light receiving element and the integrated circuit is connected with one or a plurality of protection diodes. Each protection diode is provided in series or in parallel between the light receiving element and/or the integrated circuit, and a terminal. In this photo IC, the use of the photodiode as a protection diode allows a greater p-n junction surface than that of a transistor to be ensured, thereby making it possible to prevent electric field concentration due to surge current that would lead to dielectric breakdown of the protection diode.

ACTIVE MATRIX SUBSTRATE, AND X-RAY IMAGING PANEL

TECHNICAL FIELD

The present invention disclosed herein relates to an active matrix substrate and an X-ray imaging panel.

BACKGROUND ART

An active matrix substrate that includes a protection circuit for protecting driving elements such as switching elements from static electricity has been conventionally known. JP-A-2009-260305 discloses a photo IC that includes a light receiving element, an integrated circuit including a plurality of transistors, and a protection diode. As a protection diode, a photodiode is used, and each of the light receiving element and the integrated circuit is connected with one or a plurality of protection diodes. Each protection diode is provided in series or in parallel between the light receiving element and/or the integrated circuit, and a terminal. In this photo IC, the use of the photodiode as a protection diode allows a greater p-n junction surface than that of a transistor to be ensured, thereby making it possible to prevent electric field concentration due to surge current that would lead to dielectric breakdown of the protection diode.

In the above-described photo IC, however, since a cathode of each protection diode is connected with a light receiving element, if a greater surge current runs in a forward-bias direction of the protection diode, the surge current will cause electric current to flow from the cathode of the protection diode into the light receiving element, which could possibly break the light receiving element.

SUMMARY OF THE INVENTION

To solve the above-described problem, the active matrix substrate disclosed below includes a gate line; a data line that intersects with the gate line; a photoelectric conversion element that is provided in a pixel defined by the gate line and the data line; a bias line that is connected with the photoelectric conversion element; a bias terminal that is connected with the bias line and supplies a bias voltage to the bias line; a first line to which a predetermined voltage higher than the bias voltage is supplied; and a first protection circuit that is connected in a reverse-biased state between the bias terminal and the first line, and is formed with a nonlinear element.

With the above-described configuration, it is unlikely that photoelectric conversion elements provided on the active matrix substrate would be broken due to static electricity.

MODE FOR CARRYING OUT THE INVENTION

Figure 1:
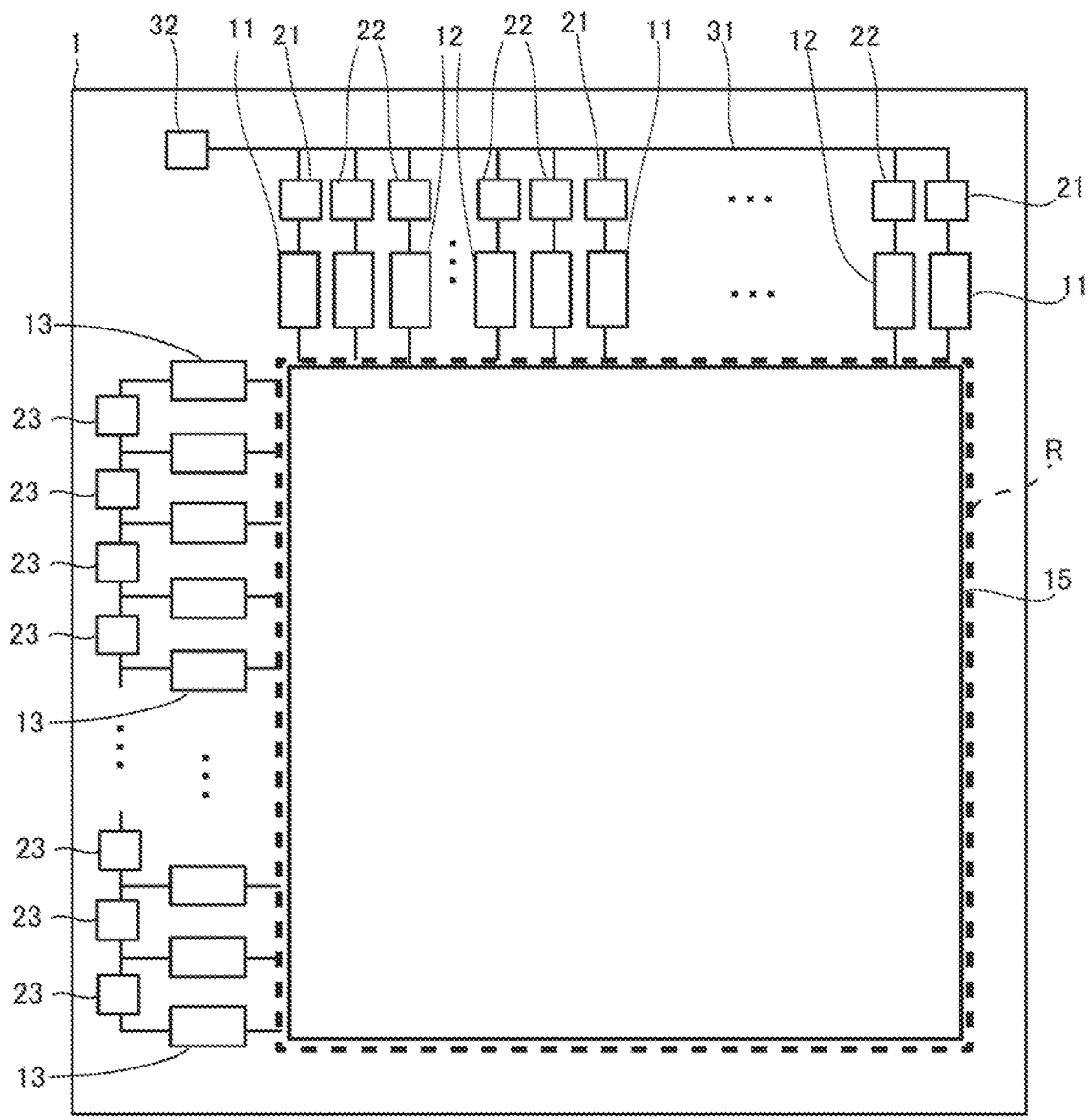
FIG. 1 is a plan view showing a schematic configuration of an active matrix substrate of Embodiment 1.

The following description describes embodiments of the present invention in detail, while referring to the drawings. Identical or equivalent parts in the drawings are denoted by the same reference numerals, and the descriptions of the same are not repeated.

Embodiment 1

(Configuration)

FIG. 1 is a plan view showing a schematic configuration of an active matrix substrate in the present embodiment. The active matrix substrate 1 shown in FIG. 1 can be used in, for example, an X-ray imaging panel. More specifically, by providing a scintillator for converting X-rays transmitted through an object into fluorescence (scintillation light) on one of surface sides of the active matrix substrate 1, an X-ray imaging panel can be manufactured. The active matrix substrate 1 in the present embodiment is an active matrix substrate before the scintillator are provided thereon, and influences of static electricity or leakage current that occurs in the process of the manufacture is suppressed.

Figure 2:
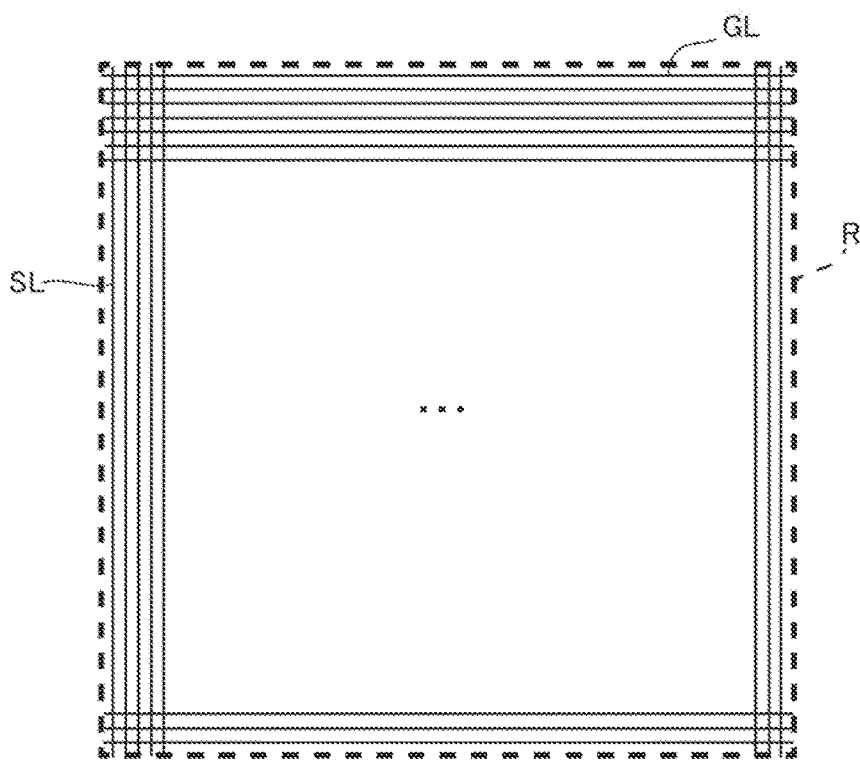
FIG. 2 is a plan view showing a schematic configuration of a pixel region of the active matrix substrate shown in FIG. 1.

An area indicated with "R" in FIG. 1 is an X-ray image pickup area (hereinafter referred to as a "pixel region"). FIG. 2 is a plan view showing a schematic configuration of the pixel region R of the active matrix substrate 1. The following description describes the configuration of the active matrix substrate 1, while referring to FIGS. 1 and 2.

As shown in FIG. 2, in the pixel region R, a plurality of data lines SL, and a plurality of gate lines GL that intersect with the data lines SL, are provided. A plurality of pixels are formed, being defined by the data lines SL and the gate lines GL, whereby the pixel region R is formed with the pixels.

As shown in FIG. 1, outside the pixel region R of the active matrix substrate 1, a plurality of terminals 11 to 13. Further, a line 15 is provided so as to surround the pixel region R. Though the illustration is omitted in this drawing, lines branched out of the line 15 are arranged so as to be approximately parallel to the gate lines GL in the pixel region R. Hereinafter the line 15 and the lines branched out of the line 15 are generally referred to as "bias lines".

The terminals 11 and the terminals 12 are provided in an external area on one of end sides of the data lines SL shown in FIG. 2, and the terminals 13 are provided in an external area on one of end sides of the gate line GL shown in FIG. 2.

Each terminal 11 is connected with the bias line 15. The terminals 12 are connected with different ones of the data lines SL, respectively. The terminals 13 are connected with different ones of the gate lines GL, respectively. Hereinafter the terminals 11 are referred to as "bias terminals 11", the terminals 12 are referred to as "data terminals 12", and the terminals 13 are referred to as "gate terminals 13".

Further, on the active matrix substrate 1, a plurality of protection circuits 21, a plurality of protection circuits 22, and a plurality of protection circuits 23 (23a, 23b), which are connected with the bias terminals 11, the data terminals 12, and the gate terminals 13, respectively, are provided in areas outside the pixel region R. Further, on the active matrix substrate 1, a common line 31 to which the protection circuits 21 and the protection circuits 22 are connected, as well as a GND terminal 32 that is connected with the common line 31 and has a predetermined reference potential, are provided in an area outside the pixel region R.

Figure 3:
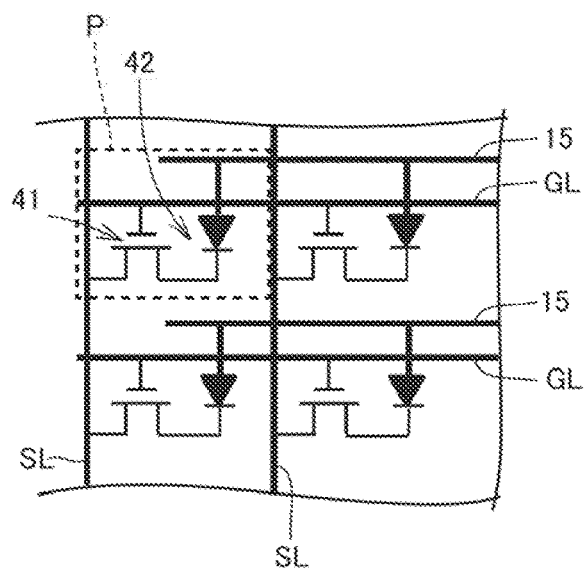
FIG. 3 is an equivalent circuit diagram showing a schematic configuration of a pixel in Embodiment 1.

Here, the following description describes a configuration of the pixel in the pixel area R. FIG. 3 is an equivalent circuit diagram showing a schematic configuration of the pixel. As shown in FIG. 3, a thin film transistor (TFT) 41 and a photoelectric conversion element 42 are provided in the pixel P.

In the present embodiment, the photoelectric conversion element 42 includes a PIN photodiode. The source of TFT 41 is connected with the data line SL, and the drain of TFT 41 is connected with the cathode electrode of the photoelectric conversion element 42. In the pixel P, the bias line 15 is connected with the anode electrode of the photoelectric conversion element 42 via an insulating film that is not shown.

Incidentally, though not being shown in FIG. 1 and the like, a driving circuit that applies a scanning voltage to scan the gate lines GL, and a readout circuit that reads out charges converted by the photoelectric conversion elements 42 from the data lines SL are connected to the active matrix substrate 1. When TFT 41 connected with the gate line GL scanned is turned ON, an electric signal corresponding to the charges converted by the photoelectric conversion element 42 is output through the data line SL to the readout circuit.

Figure 4:
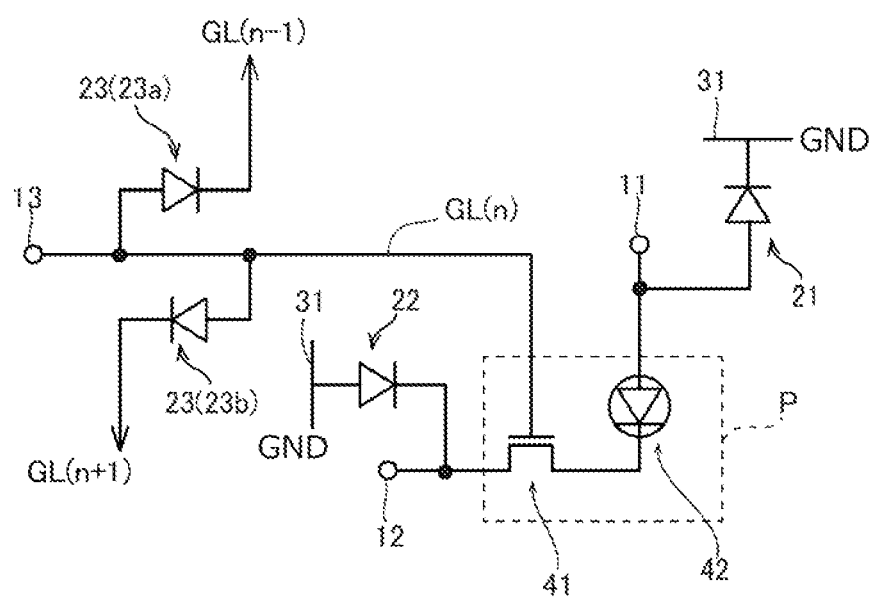
FIG. 4 is an equivalent circuit diagram of a bias terminal, a data terminal, and a gate terminal connected with a TFT and a photoelectric conversion element, as well as protection circuits in Embodiment 1.

Next, the following description describes configurations of the protection circuits 21 to 23. FIG. 4 is an equivalent circuit diagram of the bias terminal 11, the data terminal 12, and the gate terminal 13 that are connected with the TFT 41 and the photoelectric conversion element 42 of the pixel P defined by the gate lines GL(n) and the data lines SL, as well as the protection circuits 21 to 23.

Each of the protection circuits 21 to 23 includes one PIN photodiode. Further, though the illustration is omitted herein, each of the protection circuits 21 to 23 includes a light-shielding layer covering the PIN photodiode, so as not to generate photoelectric current in the protection circuits 21 to 23.

In the protection circuit 21, the anode electrode thereof is connected with the bias terminal 11, and the cathode electrode thereof is connected with the common line 31.

In the protection circuit 22, the anode electrode thereof is connected with the common line 31, and the cathode electrode thereof is connected with the data terminal 12.

As to the protection circuit 23a, the anode electrode thereof is connected with the gate line GL(n), and the cathode electrode thereof is connected with the gate line GL(n−1), which is of the previous stage of the gate line GL(n). Further, as to the protection circuit 23b, the anode electrode thereof is connected with the gate line GL(n), and the cathode electrode thereof is connected with the gate line GL(n+1), which is of the subsequent stage of the gate line GL(n). In other words, the protection circuit 23a is connected with the gate line GL(n−1) of the previous stage, which is scanned before the gate line GL(n) is scanned, and the protection circuit 23b is connected with the gate line GL(n+1) of the subsequent stage, which is scanned after the gate line GL(n) is scanned.

In this example, the data terminal 12 and the data line SL have potentials of, for example, about 1 V, which is higher than the potential of the common line 31 (the reference potential). Further, the bias terminal 11 and bias line 15 have potentials of, for example, about −6 V, which is lower than the potential of the common line 31. The gate line GL has a potential of, for example, about +20 V when the gate line GL is scanned and is in the scanned selected state, and has a potential about −10 V when the gate line GL is in a non-selected state.

As the protection circuit 21 is connected in a reverse-biased state, between the bias terminal 11 and the common line 31, electric current does not flow in this state through the protection circuit 21 toward the photoelectric conversion element 42 side. Further, assuming a case where static electricity greater than the potential of the common line 31 flows in from the bias terminal 11 side, the protection circuit 21 comes into a forward-biased state, but as static electricity can be flowed to the common line 31 through the protection circuit 21, the photoelectric conversion element 42 can be protected from the static electricity. Incidentally, electric current cannot be flowed to the GND terminal 32 side in a reverse-biased state. However, since the bias line 15 has a greater capacitance as compared with a case where no protection circuit 21 is provided, the voltage of the bias line 15 when static electricity enters the bias terminal 11 exhibits more gradual variation with time. In this case as well, therefore, influences of static electricity can be smaller to some extent.

Further, as the protection circuit 22 is connected in a reverse-biased state between the data terminal 12 and the common line 31, electric current does not flow in this state between the data line SL and the common line 31 through the protection circuit 22. Further, assuming a case where static electricity having a potential higher than that of the common line 31 flows in from the data terminal 12 side, the protection circuit 22 remains in the a reverse-biased state as long as the static electricity does not exceed the breakdown voltage of the protection circuit 22, and electric current does not flow between the data line SL and the common line 31.

The protection circuits 23a and 23b come into a reverse-biased state when the gate line GL(n) is in a non-selected state and the gate line GL(n−1) or the gate line GL(n+1) is in a selected state; and the protection circuits 23a and 23b come into a forward-biased state when the gate line GL(n) is selected. When the protection circuits 23a, 23b come into a forward-biased state, electric current flows through the gate lines GL(n−1) and GL(n+1) via the protection circuits 23a, 23b, but the gate line GL(n−1) and the gate line GL(n+1) are in a non-selected state. Since the voltage in the non-selected state is supplied to the gate line GL(n−1) and the gate line GL(n+1), the gate line GL(n−1) and the gate line GL(n+1) maintain the non-selected state even if the gate line GL(n) makes a transition to a selected state, and therefore the reading of data from the pixels involving the gate line GL(n) is not affected. Further, when the protection circuit 23a and the protection circuit 23b are in a reverse-biased state, electric current does not flow through the gate line GL(n) via the protection circuit 23a and the protection circuit 23b, and the reading of data from the pixel P is not affected.

Assuming a case where static electricity having a potential greater than those of the gate lines GL(n−1), GL(n+1) from the gate terminal 13 side, the protection circuits 23a, 23b come into a forward-biased state. This allows static electricity to go into the gate line GL(n−1) or GL(n+1), whereby making it possible to protect the TFT 41 from static electricity.

Figure 5:
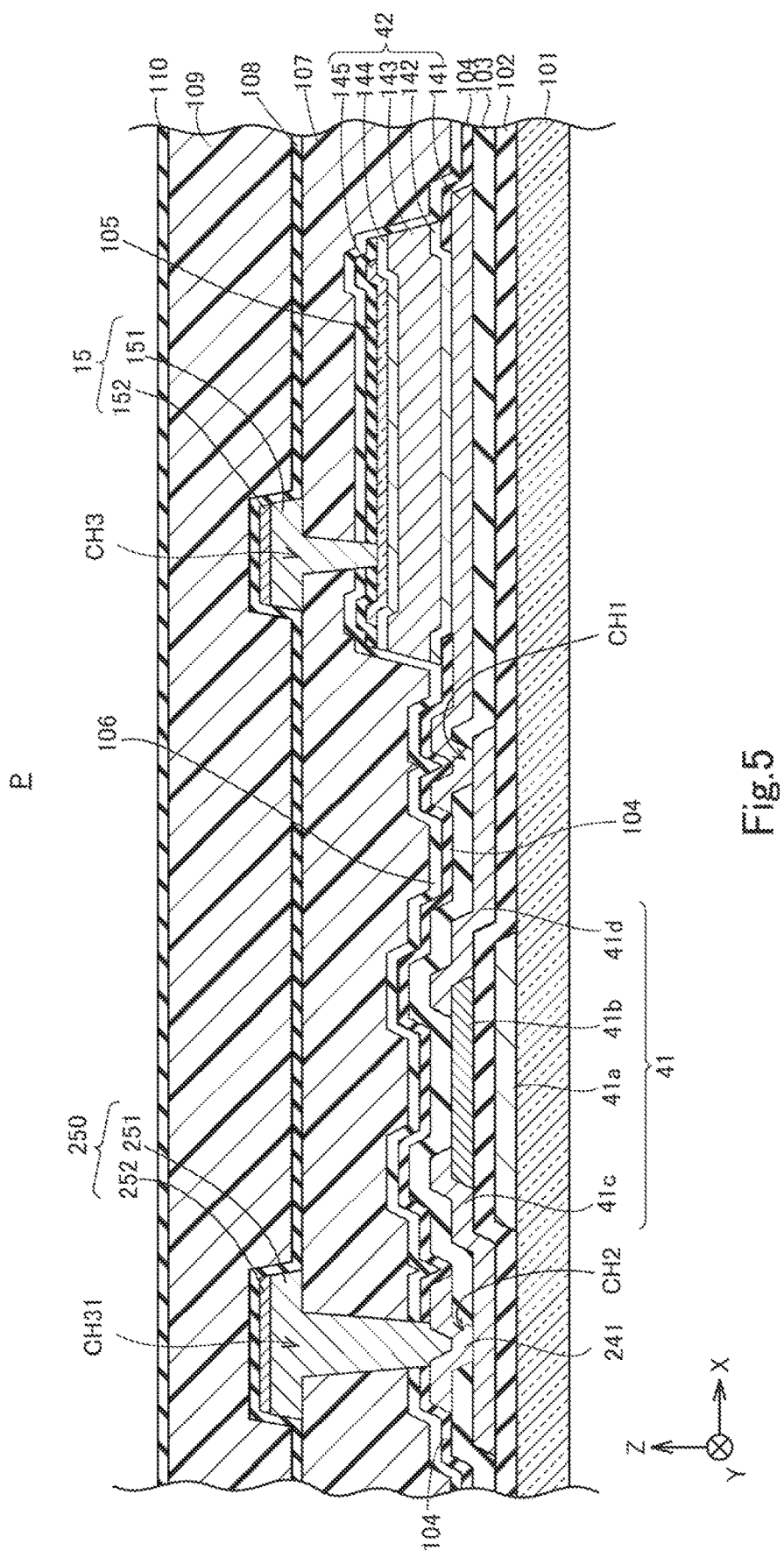
FIG. 5 is a schematic cross-sectional view of a pixel in Embodiment 1.
Figure 6:
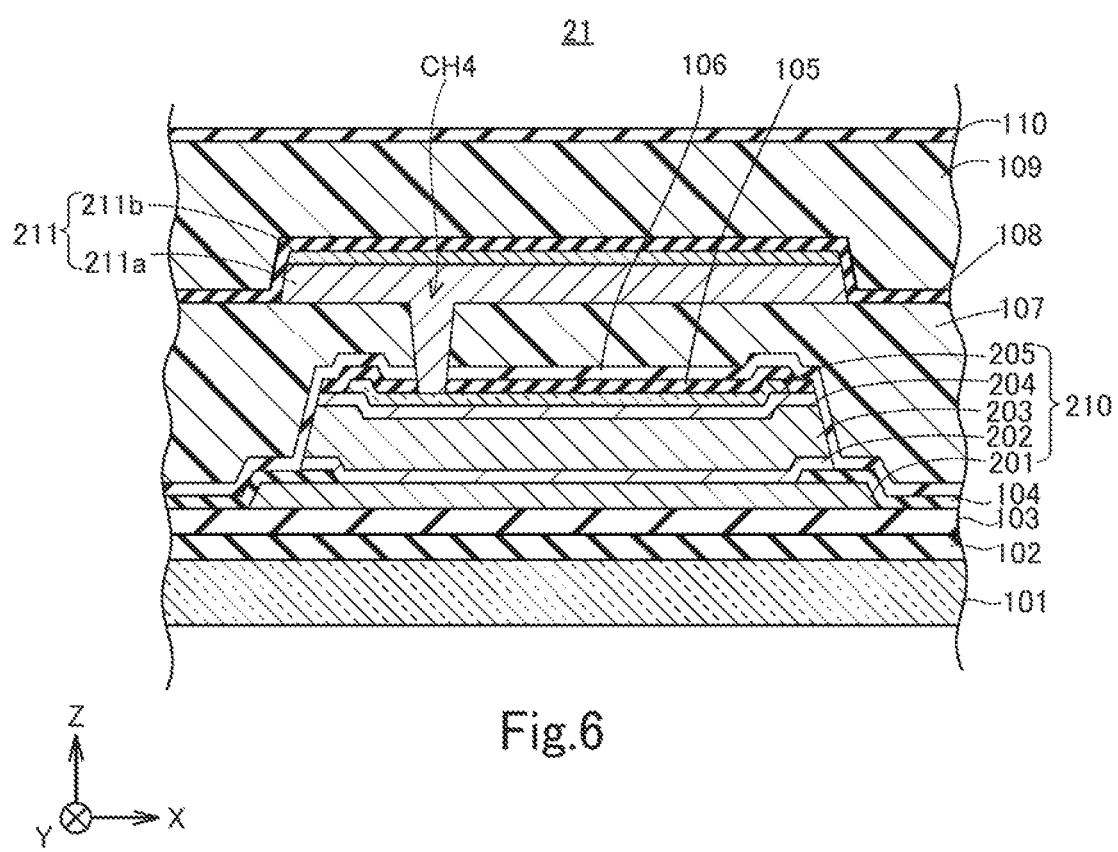
FIG. 6 is a schematic cross-sectional view of a protection circuit in Embodiment 1.

Next, the following description describes a cross-sectional structure of the pixel P, and a cross-sectional structure of the protection circuits 21 to 23. FIG. 5 is a cross-sectional view of the pixel P in the present embodiment, and FIG. 6 shows a cross-sectional structure of the protection circuit 21 in the present embodiment. Here, the description refers to the protection circuit 21 as an example, but the protection circuits 22 and 23 also have the same cross-sectional structure as that of the protection circuit 21.

As shown in FIG. 5, in the pixel P, a gate electrode 41a and a gate insulating film 102 are formed on the substrate 101. The substrate 101 is a substrate having insulating properties, and is formed with, for example, a glass substrate.

In this example, the gate electrode 41a has a laminate structure obtained by laminating a metal film made of tantalum nitride (TaN) and a metal film made of tungsten (W) in this order from the lower layer. The metal film made of tantalum nitride (TaN) and the metal film made of tungsten (W) preferably have thicknesses of about 30 nm, and 300 nm, respectively. In the present embodiment, the gate line GL may have the same structure as that of the gate electrode 41a, or may have the same structure as that of the source electrode and the drain electrode of the TFT described below. The gate electrode 41a and the gate line GL may include a single layer or a plurality of layers, i.e., two or more layers; the material and the thickness thereof are not limited to those described above, either.

The gate insulating film 102 covers the gate electrode 41a. In the present example, the gate insulating film 102 has a laminate structure obtained by laminating inorganic insulating films made of silicon nitride ($SiN_x$) and silicon oxide ($SiO_2$), respectively, in this order from the lower layer. The films of silicon nitride ($SiN_x$) and silicon oxide ($SiO_2$) preferably have thicknesses of about 325 nm and about 10 nm, respectively. The configuration of the gate insulating film 102, however, is not limited to the above-described configuration, and may be formed with a single layer or a plurality of layers, i.e., two or more layers. Further, the material and the thickness of the gate insulating film 102 are not limited to the material and the thickness described above, either.

A semiconductor active layer 41b, as well as a source electrode 41c and a drain electrode 41d connected with the semiconductor active layer 41b are provided on the gate electrode 41a, with the gate insulating film 102 being interposed.

The semiconductor active layer 41b is formed with an oxide semiconductor. In this example, the semiconductor active layer 41b has a laminate structure obtained by laminating two layers of oxide semiconductors containing indium (In), gallium (Ga), zinc (Zn) and oxygen (O) at predetermined ratios. These two layers of oxide semiconductors, i.e., the lower layer and the upper layer, have thicknesses of about 70 nm, and 35 nm, respectively.

Incidentally, as the oxide semiconductor used for forming the semiconductor active layer 41b, for example, the following material may be used, other than those described above: $InGaO_3(ZnO)_5$; magnesium zinc oxide ($Mg_xZn_{1-x}O$); cadmium zinc oxide ($Cd_xZn_{1-x}O$); cadmium oxide (CdO); InSnZnO (containing indium (In), tin (Sn), and zinc (Zn)); an indium(In)-aluminum (Al)-zinc (Zn)-oxide (O)-based amorphous oxide semiconductor; or an amorphous oxide semiconductor containing indium (In), gallium (Ga), and zinc (Zn) at a predetermined ratio. Further, as the oxide semiconductor, a material of "amorphous" or "crystalline (polycrystalline, microcrystalline, c-axis alignment)" material may be applied. In a case where the semiconductor active layer 41b has a laminate structure, any combination of the above-described materials may be used.

By using the oxide semiconductor as described above, the off-leakage current of the TFT 41 is reduced, as compared with a case where amorphous silicon(a-Si) is used. Further, when off-leakage current of the TFT 41 is reduced, noise components of detected signals decrease, which causes the X-ray detection sensitivity (S/N ratio) to improve.

The source electrode 41c and the drain electrode 41d are arranged on the gate insulating film 102 so as to be in contact with a part of the semiconductor active layer 41b. The source electrode 13c and the drain electrode 13d have a laminate structure obtained by laminating films of titanium (Ti), aluminum (Al), and titanium (Ti) in the stated order. These metal films, in the order from the lower layer, preferably have thicknesses of about 30 nm, 400 nm, and 50 nm, respectively. The structure of the source electrode 13c and the drain electrode 13d, however, is not limited to the above-described structure, and may be a single layer structure, or a laminate structure of two or more layers. Further, the materials and the thicknesses of the source electrode 41c and the drain electrode 41d are not limited to the materials and the thicknesses described above.

On the gate insulating film 102, an insulating film 103 is provided so as to partially cover the source electrode 41c and the drain electrode 41d. In the parts of the insulating film 103 that overlap with the parts of the source electrode 41c and the drain electrode 41d, contact holes CH1 and CH2 passing through the insulating film 103 are formed, respectively.

The insulating film 103 is formed with silicon oxide ($SiO_2$). The insulating film 103 has a thickness of about 500 nm. The structure of the insulating film 103, however, is not limited to the above-described structure, and may be a single layer, or a plurality of layers, i.e., two or more layers; in a case where the insulating film 103 is formed with a single layer, it is preferable to use silicon oxide ($SiO_2$). Further, the material and the thickness of the insulating film 103 are not limited to the material and the thickness described above.

On insulating film 103, a cathode electrode 141 and a data terminal connection part 241 are provided so as to be separated from each other, so as to cover the contact hole CH1 and the contact hole CH2, respectively. The cathode electrode 141 is connected with the drain electrode 41d through the contact hole CH1, and the data terminal connection part 241 is connected with the source electrode 41c through the contact hole CH2. The source electrode 41c is connected with the data terminal 12 through the data terminal connection part 241.

The cathode electrode 141 and the data terminal connection part 241 have a laminate structure obtained by laminating metal films of titanium (Ti), aluminum (Al), and titanium (Ti) in the stated order in this example. These metal films, in the order from the lower side, preferably have thicknesses of about 30 nm, 300 nm, and 100 nm, respectively. The structure of the cathode electrode 141 and the data terminal connection part 241, however, is not limited to the above-described structure, and may be a single layer structure. Further, the materials and the thicknesses of the cathode electrode 141 and the data terminal connection part 241 are not limited to the materials and the thicknesses described above.

On the cathode electrode 141, an n-type amorphous semiconductor layer 142, an intrinsic amorphous semiconductor layer 143, and a p-type amorphous semiconductor layer 144 are laminated in this order as semiconductor layers.

The n-type amorphous semiconductor layer 142 is formed with amorphous silicon doped with an n-type impurity (for example, phosphorus).

The intrinsic amorphous semiconductor layer 143 is formed with intrinsic amorphous silicon. The intrinsic amorphous semiconductor layer 143 is formed in contact with the n-type amorphous semiconductor layer 142.

The p-type amorphous semiconductor layer 144 is formed with amorphous silicon doped with a p-type an impurity (for example, boron). The p-type amorphous semiconductor layer 144 is formed in contact with the intrinsic amorphous semiconductor layer 143.

In this example, the n-type amorphous semiconductor layer 142, the intrinsic amorphous semiconductor layer 143, and the p-type amorphous semiconductor layer 144 preferably have thicknesses of about 10 nm, 1200 nm, and 10 nm, respectively.

The dopants and the thicknesses of the n-type amorphous semiconductor layer 142, the intrinsic amorphous semiconductor layer 143, and the p-type amorphous semiconductor layer 144, however, are not limited to those described above.

On the p-type amorphous semiconductor layer 144, an anode electrode 145 is provided. The anode electrode 145 is provided on the inner side with respect to ends of the semiconductor layer composed of the n-type amorphous semiconductor layer 142, the intrinsic amorphous semiconductor layer 143, and the p-type amorphous semiconductor layer 144. In other words, the anode electrode 145 has a length in the X-axis direction that is shorter than that of the semiconductor layer. To form the anode electrode 145, for example, a transparent conductive film made of indium tin oxide (ITO) is used. The anode electrode 145 preferably has a thickness of about 60 nm. The material and the thickness of the anode electrode 145, however, are not limited to those described above.

On the p-type amorphous semiconductor layer 144, an insulating film 105 is provided so as to cover the anode electrode 145. Further, on an insulating film 104, an insulating film 106 is provided so as to cover the insulating film 105. In other words, the insulating film 106 covers the insulating film 105, and at the same time covers the side surfaces of the semiconductor layer. On the insulating film 106, a flattening film 107 is provided so as to cover the insulating film 106. An organic insulating film made of a photosensitive resin is used as the flattening film 107 in this example.

On the anode electrode 145, a contact hole CH3 passing through the insulating film 105, the insulating film 106, and the flattening film 107 is formed. Further, a contact hole CH31 passing through the insulating film 104, the insulating film 106, and the flattening film 107 is formed at a position that overlaps with the contact hole CH2 when viewed in a plan view.

To form the insulating film 105 and the insulating film 106, inorganic insulating films made of silicon nitride (SiN) are used in this example. The insulating film 105 preferably has a thickness of about 50 nm, and the insulating film 106 preferably has a thickness of about 250 nm. The materials and the thicknesses of the insulating film 105 and the insulating film 106, however, are not limited to those described above.

As the flattening film 107, an organic insulating film made of a photosensitive resin is used in this example. The flattening film 107 preferably has a thickness of about 2500 nm. The structure of the flattening film 107, however, is not limited to that described above.

On the flattening film 107, a bias line 15 (151, 152) covering the contact hole CH3, and a data terminal connection line 250 (251, 252) covering the contact hole CH31, are provided. The bias line 15 is connected with the anode electrode 145 through the contact hole CH3, and the data terminal connection line 250 is connected with the data terminal connection part 241 through the contact hole CH31.

The bias line 15 and the data terminal connection line 250 are formed by providing first line layers 151 and 251 in the lower layer, respectively, which are formed with metal layers, and providing second line layer 152 and 252 in the upper layer, respectively, which are formed with transparent conductive films.

In this example, each of the first line layers 151 and 251 has a laminate structure obtained by laminating metal films of titanium (Ti), aluminum (Al), and titanium (Ti) in the stated order. These metal films, in the order from the lower side, preferably have thicknesses of about 60 nm, 600 nm, and 50 nm, respectively. The structure of the first line layers 151 and 251, however, is not limited to the above-described structure, and may be a single layer structure. Further, the materials and the thicknesses of the first line layers 151 and 251 are not limited to the materials and the thicknesses described above. The second line layers 152 and 252 are formed with, for example, ITO, and preferably have a thickness of about 100 nm. The materials and the thicknesses of the second line layers 152 and 252 are not limited to those described above.

On the flattening film 107, an insulating film 108 is provided so as to cover the bias line 15 and the data terminal connection line 250. As the insulating film 108, an inorganic insulating film made of silicon nitride (SiN) is used in this example. The insulating film 108 preferably has a thickness of about 300 nm. The structure of the insulating film 108, however, is not limited to the above-described structure.

On the insulating film 108, a flattening film 109 is provided, so that an entirety of the insulating film 108 is covered with the flattening film 109. As the flattening film 109, an organic insulating film made of a photosensitive resin is used in this example. The flattening film 109 preferably has a thickness of about 2500 nm. The structure of the flattening film 109, however, is not limited to the above-described structure.

On the flattening film 109, an insulating film 110 is provided, so that an entirety of the flattening film 109 is covered with the insulating film 110. As the insulating film 110, an inorganic insulating film made of silicon nitride (SiN) is used in this example. The insulating film 110 preferably has a thickness of about 150 nm. The structure of the insulating film 110, however, is not limited to the above-described structure.

The cross-sectional structure of the pixel P is as described above. Subsequently, the following description describes a cross-sectional structure of the protection circuit 21 while referring to FIG. 6. Incidentally, in FIG. 6, the same constituent members as those of the pixel P described above (FIG. 5) are denoted by the same reference symbols as those in FIG. 5.

As shown in FIG. 6, in the protection circuit 21, the gate insulating film 102 is arranged on the substrate 101, and the insulating film 103 is arranged on the gate insulating film 102.

On the insulating film 103, a photodiode 210 is provided, and a light-shielding layer 211 covering the photodiode 210 is provided above the photodiode 210. The photodiode 210 is made of the same material and has the same thickness as those of the above-described photoelectric conversion element (photodiode) 42. Further, the light-shielding layer 211 is made of the same material and has the same thickness as those of the above-described bias line 15.

More specifically, the photodiode 210 has a cathode electrode 201 that is made of the same material and has the same thickness as those of the above-described cathode electrode 141. On the cathode electrode 201, the insulating film 104 is provided so as to have separation, and an n-type amorphous semiconductor layer 202 that is made of the same material and has the same thickness as those of the above-described n-type amorphous semiconductor layer 142 is provided so as to cover the cathode electrode 201. On the n-type amorphous semiconductor layer 202, an intrinsic amorphous semiconductor layer 203 that is made of the same material and has the same thickness as those of the above-described intrinsic amorphous semiconductor layer 143; and on the intrinsic amorphous semiconductor layer 203, a p-type amorphous semiconductor layer 204 that is made of the same material and has the same thickness as those of the above-described p-type amorphous semiconductor layer 144 is provided. On the p-type amorphous semiconductor layer 204, an anode electrode 205 that is made of the same material and has the same thickness as those of the above-described anode electrode 145 is provided.

On the p-type amorphous semiconductor layer 204, the insulating film 105 is provided so as to cover the anode electrode 205, and on the insulating film 104, the insulating film 106 is provided so as to cover side surfaces of the semiconductor layer of the protection circuit 21 composed of the n-type amorphous semiconductor layer 202, the intrinsic amorphous semiconductor layer 203, and the p-type amorphous semiconductor layer 204, as well as the insulating film 105.

On the insulating film 106, the flattening film 107 is provided, and a contact hole CH4 passing through the insulating films 105 and 106 as well as the flattening film 107 is formed on the anode electrode 224.

The light-shielding layer 211 is provided on the flattening film 107 so as to cover the contact hole CH4. The light-shielding layer 211 is formed with a first light-shielding film 211a and a second light-shielding film 211b that are laminated in the lower layer and the upper layer, respectively. In this example, the first light-shielding film 211a is made of the same material and has the same thickness as those of the above-described first line layer 151, and the second light-shielding film 211b is made of the same material and has the same thickness as those of the above-described second line layer 152. In other words, the light-shielding layer 211 is formed with the same conductive film as that of the above-described bias line 15.

Incidentally, the light-shielding layer 211 of the protection circuit 21 is connected with the bias terminal 11, the light-shielding layer 211 of the protection circuit 22 is connected with the common line 31, and the light-shielding layer 211 of the protection circuit 23 is connected with the gate terminal 13 of the gate line GL(n).

Over the light-shielding layer 211, an insulating film 108 is provided so as to cover the light-shielding layer 211, and a flattening film 109 and an insulating film 110 are laminated on the insulating film 108.

The cross-sectional structure of the protection circuits 21 to 23 in the present embodiment is as described above. As described above, the structure of the photoelectric conversion element (photodiode) 42 and the bias line 15 in the pixel P, and the structure of the photodiode 210 and the light-shielding layer 211 in the protection circuits 21 to 23 are the same, respectively. This makes it possible to produce the protection circuits 21 to 23 as well, in the step of producing the pixel P. Further, as the light-shielding layer 211 overlaps with the photodiode 210 when viewed in a plan view and covers an entirety of the photodiode 210, light incidence onto the photodiode 210 is decreased, which makes it unlikely that photoelectric current would be generated in the photodiode 210. Photoelectric current, therefore, does not flow through the protection circuits 21 to 23 into the pixel P, resulting in that there is substantially no influence on the detection result at the pixel P.

Embodiment 2

Embodiment 1 described above is described with reference to an exemplary configuration where the protection circuit 22 is connected in a reverse-biased state between the common line 31 connected with the GND terminal 32 and the data terminal 12. In Embodiment 1, in a case where negative static electricity having a potential smaller than that of the common line 31 flows in from the data terminal 12 side, the protection circuit 22 comes into a forward-biased state, and electric current flows through the protection circuit 22 between the data line SL and the common line 31. The present embodiment is described with reference to a structure in which it is unlikely that electric current would flow to the data line SL through the protection circuit 22 when the protection circuit 22 comes into a forward-biased state.

Figure 7:
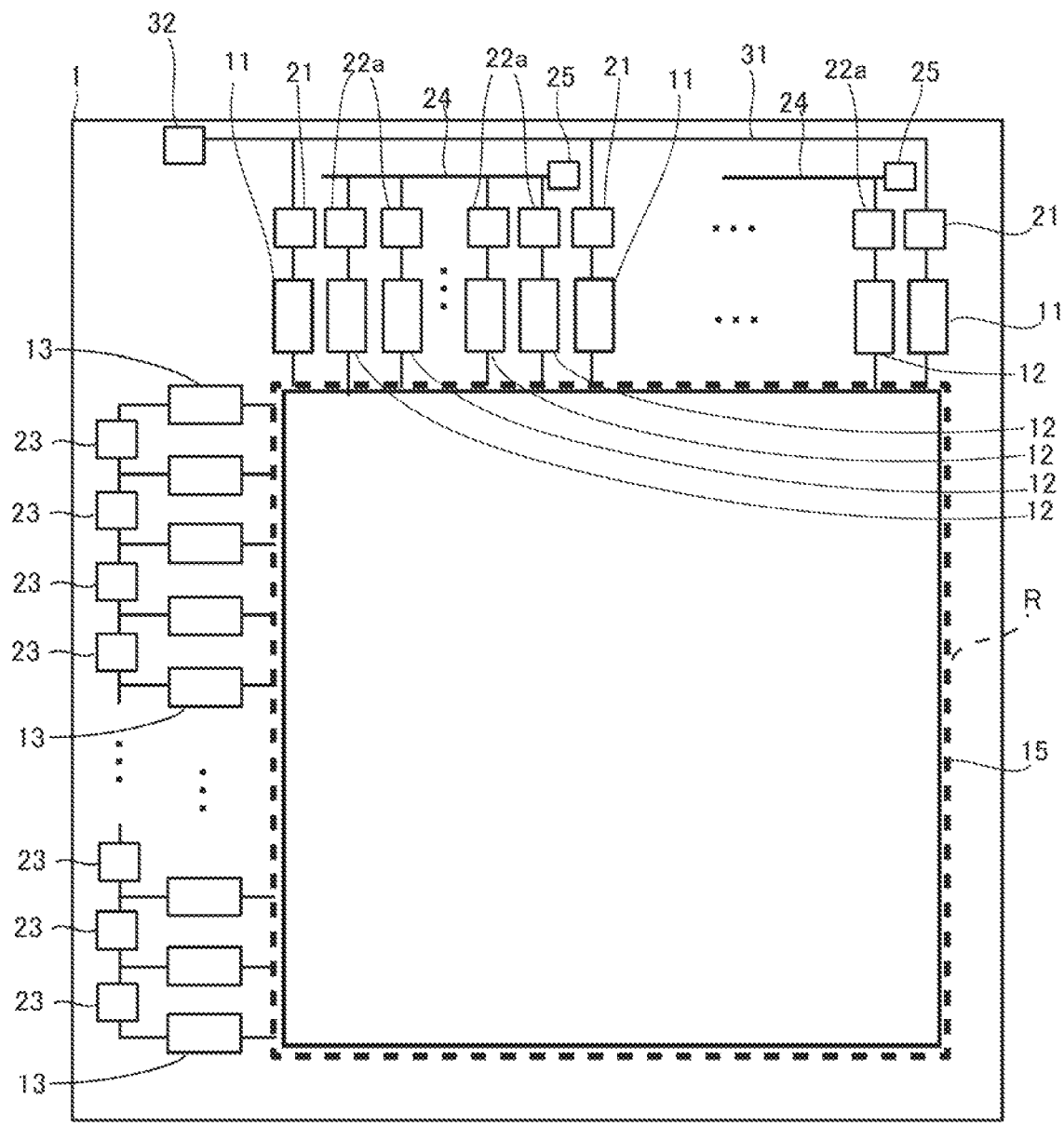
FIG. 7 is a plan view showing a schematic configuration of an active matrix substrate in Embodiment 2.

FIG. 7 is a plan view showing a schematic configuration of an active matrix substrate in the present embodiment. In FIG. 7, the same constituent members as those in FIG. 1 are denoted by the same reference symbols as those in FIG. 1. The following description principally describes constituent members different from those in Embodiment 1.

As shown in FIG. 7, an active matrix substrate 1A includes protection circuits 22a connected with the data terminals 12, lines 24 connected with the protection circuits 22a, and terminals 25 connected with the lines 24.

The protection circuit 22a is composed of the same photodiode 210 and light-shielding layer 211 as those in the protection circuit 22. To the terminal 25, a voltage V1 is applied from an external circuit (not shown). The voltage V1 is higher than a voltage Vd supplied to the data line SL. The lines 24 are not connected with the other lines and the like, and are arranged outside the pixel region R.

Figure 8:
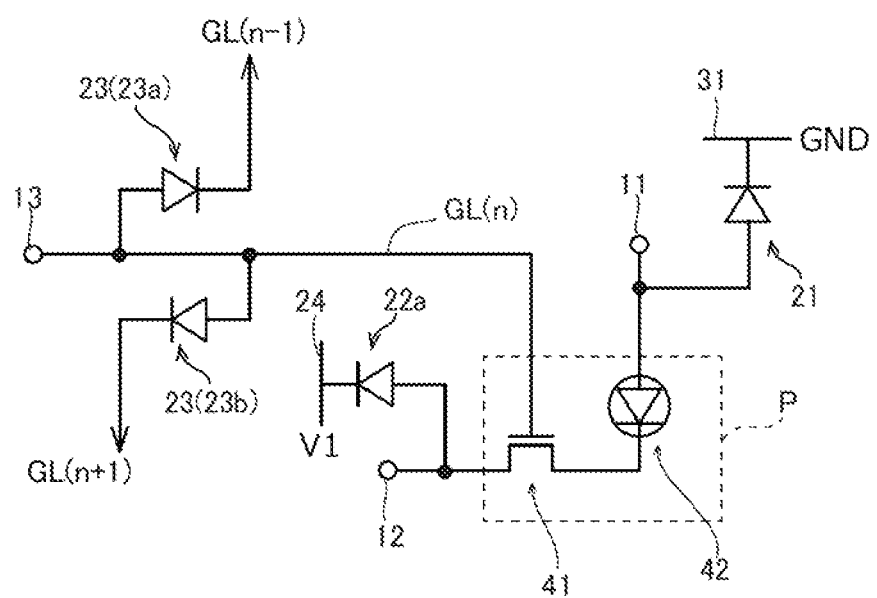
FIG. 8 is an equivalent circuit diagram of a bias terminal, a data terminal, and a gate terminal connected with a TFT and a photoelectric conversion element, as well as protection circuits in Embodiment 2.

FIG. 8 is an equivalent circuit diagram of the bias terminal 11, the data terminal 12, and the gate terminal 13 that are connected with the TFT 41 and the photoelectric conversion element 42 of the pixel P(n), as well as the protection circuits 21, 22a, 23.

As shown in FIG. 8, the protection circuit 22a is connected in a reverse-biased state between the data terminal 12 and the line 24. In this state, electric current does not flow into the data line SL through the protection circuit 22a. Further, assuming a case where static electricity having a potential higher than the potential V1 of the line 24 flows in from the data terminal 12 side and the protection circuit 22a comes into a forward-biased state, static electricity can be released through the protection circuit 22a to the line 24, which makes it possible to protect the TFT 41 from static electricity.

Embodiment 3

The present embodiment is described with reference to an exemplary configuration in which the light receiving area of the photoelectric conversion element 42 is improved as compared with those in Embodiments 1 and 2 described above.

Figure 9:
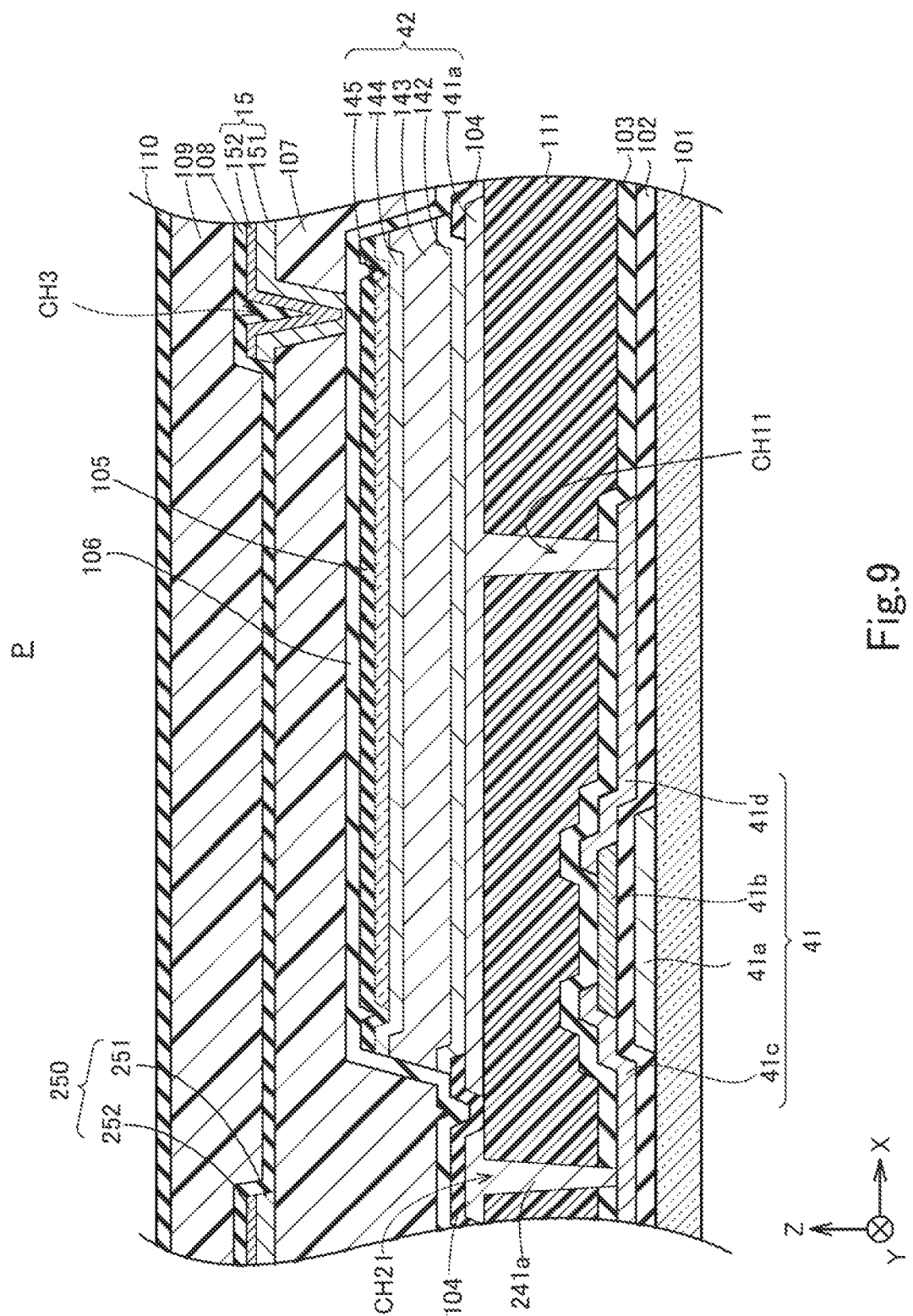
FIG. 9 is a schematic cross-sectional view of a pixel in Embodiment 3.
Figure 10:
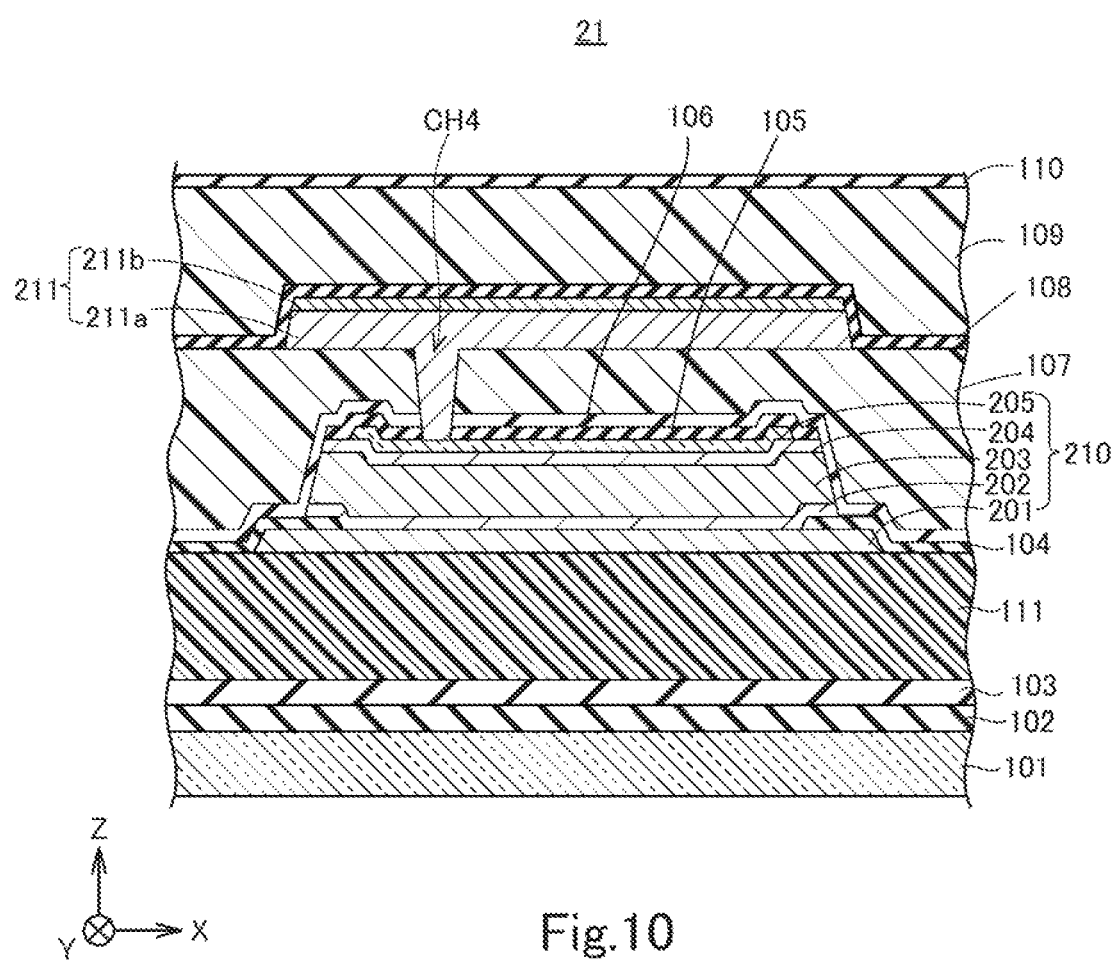
FIG. 10 is a schematic cross-sectional view of a protection circuit in Embodiment 3.

FIG. 9 is a schematic cross-sectional view of the pixel P in the present embodiment. FIG. 10 is a schematic cross-sectional view of the protection circuit 21 in the present embodiment. Incidentally, in FIG. 10, only the protection circuit 21 is shown for convenience sake, but the other protection circuits 22 and 23 have the same configuration as that of the protection circuit 21. Further, in FIGS. 9 and 10, the same constituent members as those in Embodiment 1 (see FIGS. 5 and 6) are denoted by the same reference symbols as those in Embodiment 1. The following description principally describes constituent members different from those in Embodiment 1.

As shown in FIGS. 9 and 10, in the present embodiment, a flattening film 111 is provided on the insulating film 103, and an anode electrode 141a of the photoelectric conversion element 42, a data terminal connection part 241a, and the insulating film 104 are provided on the flattening film 111.

In the present embodiment, a contact hole CH21 passing through the flattening film 111 and the insulating film 103 is formed at a position that overlaps with the source electrode 41c when viewed in a plan view, and a contact hole CH11 passing through the flattening film 111 and the insulating film 103 is formed at a position that overlaps with the drain electrode 41d when viewed in a plan view. The anode electrode 141a and the drain electrode 41d are connected through the contact hole CH11, and the data terminal connection part 241a and the source electrode 41c are connected through the contact hole CH21.

In this way, the flattening film 111 is provided between the TFT 41 and the photoelectric conversion element 42, whereby the TFT 41 and the photoelectric conversion element 42 can be arranged so as to overlap with each other when viewed in a plan view. In other words, the TFT 41 and the photoelectric conversion element 42 do not have to be arrayed in the X-axis direction of the pixel P as in Embodiment 1, and the degree of freedom in the arrangement of the photoelectric conversion element 42 is improved. As a result, the size of the light receiving area of the photoelectric conversion element 42 can be increased as compared with Embodiment 1, whereby the amount of the light received by the photoelectric conversion element 42 can be increased.

Embodiment 4

Embodiments 1 to 3 are described with reference to an exemplary configuration in which each of the protection circuits 21 to 23 is composed of one photodiode 210 and the light-shielding layer 211. The description of the present embodiment describes a protection circuit having a configuration different from that in Embodiments 1 to 3.

Figure 11:
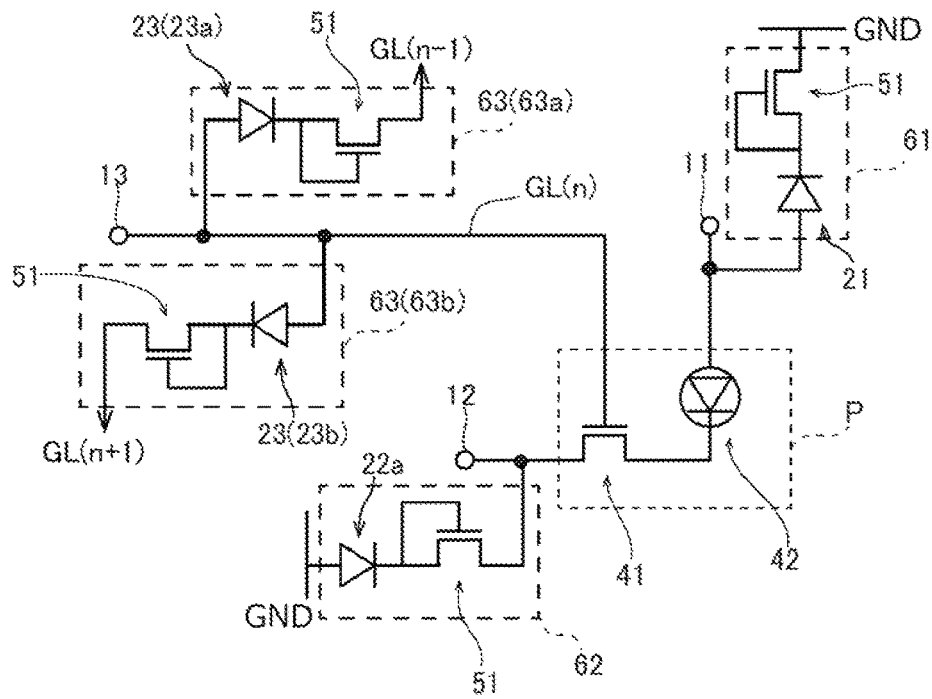
FIG. 11 is an equivalent circuit diagram of a bias terminal, a data terminal, and a gate terminal connected with a TFT and a photoelectric conversion element, as well as protection circuits in Embodiment 4.

FIG. 11 is an equivalent circuit diagram of protection circuits in the present embodiment, as well as the bias terminal 11, the data terminal 12, and the gate terminal 13 connected with the TFT 41 of the pixel P and a photoelectric conversion element 42. In FIG. 11, the same constituent members as those in Embodiment 1 are denoted by the same reference symbols as those in Embodiment 1. The following description principally describes the configuration of the protection circuit in the present embodiment.

As shown in FIG. 11, the protection circuits 61 to 63 have such configurations that a TFT 51 is connected to each of the protection circuit 21 to 23 of Embodiment 1 in series, respectively. More specifically, in each of the protection circuits 21 to 23, the drain of the TFT 51 is connected to the cathode electrode of the photodiode 210, and the gate and the drain of the TFT 51 are diode-connected.

The source of the TFT 51 in the protection circuit 61 is connected to the common line 31. The source of the TFT 51 in the protection circuit 62 is connected with the data terminal 12. The source of the TFT 51 in the protection circuit 63a is connected with the gate line GL(n−1). The source of the TFT 51 in the protection circuit 63b is connected with the gate line GL(n+1).

Figure 12:
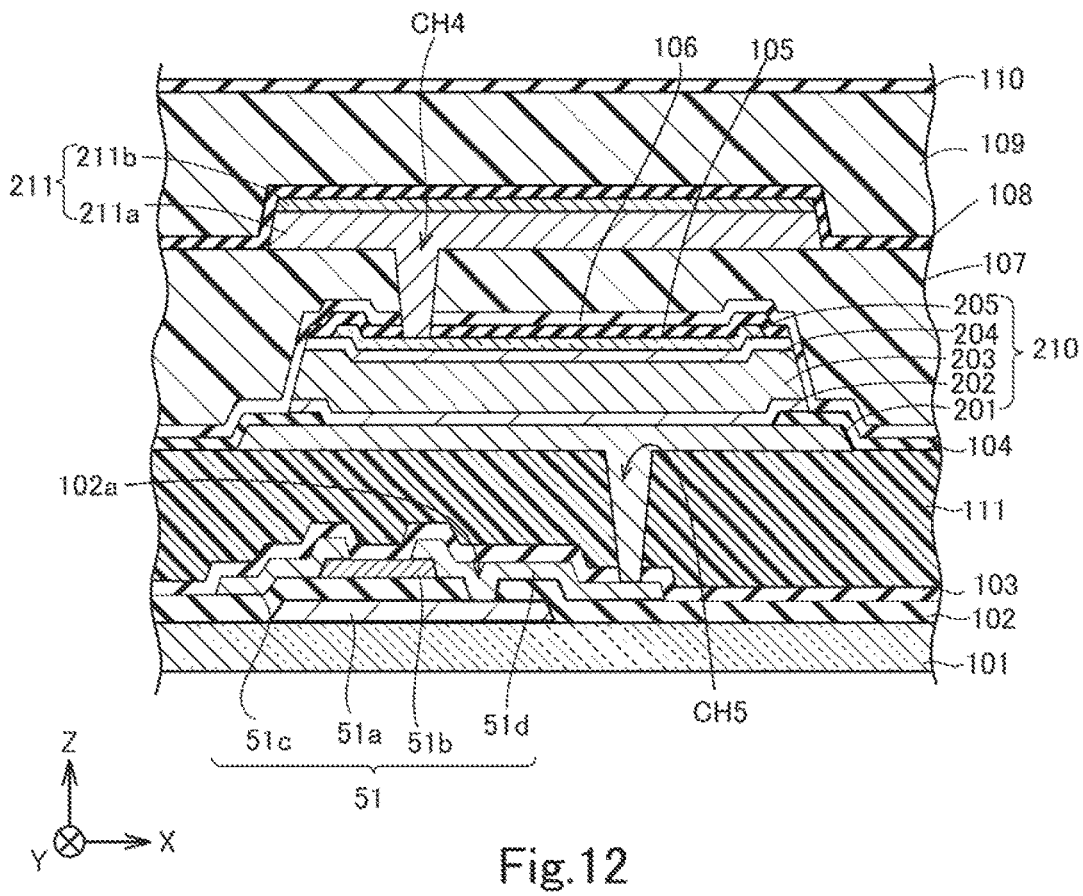
FIG. 12 is a cross-sectional view of a protection circuit in Embodiment 4.

Next, the following description describes a cross-sectional structure of the protection circuits 61 to 63. FIG. 12 is a schematic cross-sectional view of the protection circuit 61. Here, for convenience sake, the protection circuit 61 is described as an example, but the protection circuits 62 and 63 have the same configuration as that of the protection circuit 61. In FIG. 12, the same constituent members as those in the above-described embodiments are denoted by the same reference symbols as those in the above-described embodiments. The following description principally describes constituent members different from those in the above-described embodiments.

As shown in FIG. 12, in the present embodiment, the TFT 51, having the same configuration as that of the TFT 41 in the pixel P, is formed on the substrate 101. More specifically, a gate electrode 51a made of the same material and having the same thickness as those of the gate electrode 41a of the TFT 41 is arranged on the substrate 101. Further, the gate insulating film 102 is provided on the substrate 101 so as to cover the gate electrode 51a.

On the gate insulating film 102, a semiconductor active layer 51b made of the same material and having the same thickness as those of the semiconductor active layer 41b of the TFT 41 is arranged. Further, on the gate insulating film 102, a source electrode 51c and a drain electrode 51d are arranged so as to be separated on the semiconductor active layer 51b. The source electrode 51c and the drain electrode 51d are made of the same materials and have the same thicknesses as those of the source electrode 41c and the drain electrode 41d of the TFT 41, respectively. The drain electrode 51d is connected with the gate electrode 51a at the opening 102a formed in the gate insulating film 102.

On the gate insulating film 102, the insulating film 103 and the flattening film 111 are laminated so as to cover the semiconductor active layer 51b and the source electrode 51c, as well as a part of the drain electrode 51d. In the insulating film 103 and the flattening film 111, a contact hole CH5 is formed at a position that overlaps with the drain electrode 51d.

On the flattening film 111, the cathode electrode 201 of the photodiode 210 is arranged so as to cover the contact hole CH5, and the cathode electrode 201 and the drain electrode 51d are connected with each other through the contact hole CH5. The photodiode 210 above the cathode electrode 201 has the same configuration as that in the above-described embodiments.

In Embodiment 4, as all of the photodiodes 210 in the protection circuits 61 to 63 are connected in a reverse-biased state, the protection circuits 61 to 63 behave in the same manner as that of the protection circuits 21 to 23 in Embodiment 1 and the like. However, since the TFT 51 is connected in series to each of the photodiodes 210 in the protection circuits 61 to 63, the protection circuits 61 to 63 have greater resistances and capacitances, as compared with the protection circuits 21 to 23. This prevent rapid voltage changes in the protection circuits 61 to 63 when static electricity flows in the same, as compared with the above-described embodiments, and it is unlikely that the protection circuits 61 to 63 would be broken.

Incidentally, Embodiment 4 is described with reference to an exemplary configuration in which the TFT 51 is connected in series to the photodiode 210 in each of the protection circuits 61 to 63, but the configuration may be such that no TFT 51 is connected in some of the protection circuits. In other words, the TFT 51 does not have to be connected to the photodiode 210 in every protection circuit.

The above-described embodiments are merely examples for implementing the present invention. The active matrix substrate, therefore, is not limited to the above-described embodiments, and the above-described embodiments can be appropriately varied and implemented without departing from the spirit and scope of the invention.

The following description describes modification examples of the active matrix substrate.

(1) Embodiment 1 described above is described with reference to an exemplary configuration in which the protection circuit is connected to each of the bias terminal 11, the data terminal 12, and the gate terminal 13, but the configuration may be such that at least the protection circuit 21 connected with the bias terminal 11 is provided. In other words, the configuration may be such that, for example, none of the protection circuit 22 and the protection circuit 23, connected with the data terminal 12 and the gate terminal 13, respectively, is provided, or either the protection circuit 22 or the protection circuit 23 may be provided. Desirably all of the protection circuits are provided, but even in a case where only the protection circuit 21 is provided, the photoelectric conversion element 42 can be protected from static electricity.

(2) Embodiments 1 to 4 described above are described with reference to an exemplary protection circuit in which a PIN diode formed with a p-type amorphous semiconductor layer an intrinsic amorphous semiconductor layer, and an n-type amorphous semiconductor layer is used, but in the protection circuit, a PN diode formed with a p-type amorphous semiconductor layer and an n-type amorphous semiconductor layer may be used. In other words, a nonlinear element may be used as the protection circuit.

(3) Embodiments 1 to 4 described above are described with reference to an active matrix substrate on which the scintillator are not provided yet, but any one of the configurations of the above-described embodiments may be applied to an X-ray imaging panel in which the scintillator are provided on a surface on one side of an active matrix substrate. The scintillator are provided on the X-ray-irradiated surface of the active matrix substrate.

Further, this X-ray imaging panel may include a driving circuit for scanning the gate lines GL, and a readout circuit that reads out charges corresponding to fluorescence converted by the scintillator through the data lines SL from the photoelectric conversion elements 42.

(4) After the active matrix substrate in any one of Embodiments 1 to 4 is produced as an X-ray imaging panel, the protection circuits in the active matrix substrate may be cut away therefrom. The protection circuit may be used for reducing influences of leakage current or static electricity, at least in imaging inspection in the process of producing an active matrix substrate before the scintillator are provided thereon.

(5) Embodiments 1 to 4 described above may be combined in any way. In other words, as the protection circuit in Embodiment 1 and Embodiment 2, the protection circuit in Embodiment 4 may be applied. Further, the flattening film 111 in Embodiment 3 may be provided in each of Embodiment 1 and Embodiment 2.

The above-described active matrix substrate can be described as follows.

An active matrix substrate of the first configuration includes a gate line; a data line that intersects with the gate line; a photoelectric conversion element that is provided in a pixel defined by the gate line and the data line; a bias line that is connected with the photoelectric conversion element; a bias terminal that is connected with the bias line and supplies a bias voltage to the bias line; a first line to which a predetermined voltage higher than the bias voltage is supplied; and a first protection circuit that is connected in a reverse-biased state between the bias terminal and the first line, and is formed with a nonlinear element.

According to the first configuration, the photoelectric conversion element provided in the pixel is connected with the bias terminal supplying the bias voltage. The first protection circuit is connected in a reverse-biased state between the first line and the bias terminal. The predetermined voltage supplied to the first line is higher than the bias voltage. Therefore, when the first protection circuit is in a reverse-biased state, electric current does not flow through the first protection circuit to the photoelectric conversion element side. Further, in a case where static electricity having a potential higher than the bias voltage flows in from the bias terminal side, the first protection circuit comes into a forward-biased state, but static electricity is allowed to flow through the first protection circuit into the first line, which makes it possible to protect the photoelectric conversion element from static electricity.

The first configuration may be further characterized in further including: a switching element that is connected to the gate line, the data line, and the photoelectric conversion element; a gate terminal that is connected with the gate line; and a pair of second protection circuits that are formed with nonlinear elements and are provided with respect to the gate terminal, wherein the gate line is one of a plurality of gate lines, wherein the pair of second protection circuits are connected between the gate terminal, commonly, and different ones of the plurality of other gate lines, respectively, and each of the pair of second protection circuits is in a forward-biased state when the gate line connected with the gate terminal is in a selected state, and is in a reverse-biased state when the said other gate line connected to the second protection circuit is in a selected state (the second configuration).

According to the second configuration, the switching element connected with the gate line, the data line, and the photoelectric conversion element is provided, and the gate terminal is connected to the gate line. A pair of second protection circuits that are formed with nonlinear elements are connected with the gate terminal. The pair of second protection circuits are connected between the gate terminal, commonly, and different ones of the plurality of other gate lines, respectively. Each of the pair of second protection circuits is in a forward-biased state when the gate line connected with the gate terminal is in a selected state, but here, the above-mentioned other gate lines are in a non-selected state. Therefore, even if electric current flows through the second protection circuit to the above-mentioned other gate line, influences on data of a pixel involving the above-mentioned other gate lines are small. Further, when the above-mentioned other gate lines connected to the pair of the second protection circuits are in a selected state, the gate line connected with the one gate terminal, to which the pair of second protection circuits are connected, commonly, is in a non-selected state. Here, as the pair of second protection circuits are in a reverse-biased state, electric current does not flow through the second protection circuit to the gate line connected to the gate terminal. Further, even if static electricity having a potential greater than those of the above-described other gate lines flows from the gate terminal, which is common with respect to the pair of second protection circuits, static electricity can be flowed through these second protection circuits to the above-mentioned other gate lines, and which makes it possible to protect the switching element connected with the gate line from static electricity.

The second configuration may be further characterized in that a data terminal connected with the data line; and a third protection circuit that is formed with a nonlinear element, and is connected with the data terminal, wherein the data terminal has a potential higher than a predetermined potential of the first line, and the third protection circuit is connected in a reverse-biased state between the data terminal and the first line (the third configuration).

According to the third configuration, the data terminal connected with the data line is connected with the third protection circuit, which is formed with a nonlinear element. The data terminal has a potential higher than a potential of the first line, and the third protection circuit is connected in a reverse-biased state between the data terminal and the first line. Therefore, when the third protection circuit is in a reverse-biased state, electric current does not flow through the third protection circuit into the data line, and the detection result at the pixel is not affected.

The second configuration may be further characterized in further including: a data terminal connected with the data line; a second line to which a voltage higher than a voltage supplied to the data terminal is supplied; and a third protection circuit that is formed with a nonlinear element, and is connected in a reverse-biased state between the data terminal and the second line (the fourth configuration).

According to the fourth configuration, the data terminal connected with the data line is connected with the third protection circuit formed with a nonlinear element. The data terminal has a potential lower than the potential of the second line, and the third protection circuit is connected in a reverse-biased state between the data terminal and the second line. When the third protection circuit is in a reverse-biased state, therefore, electric current does not flow through the third protection circuit into the data line, and the detection result at the pixel is not affected. Further, in a case where static electricity having a potential higher than that of the second line comes in from the data terminal side, the third protection circuit comes into a forward-biased state, and static electricity is allowed to flow into the second line. As a result, it is possible to protect the switching element connected with the data line from static electricity.

The third or fourth configuration may be further characterized in that the photoelectric conversion element is formed with a photodiode, and each of the first protection circuit, the second protection circuit, and the third protection circuit includes a photodiode that has the same structure as that of the photoelectric conversion element, and a light-shielding layer that covers the photodiode (the fifth configuration).

According to the fifth configuration, each of the first protection circuit, the second protection circuit, and the third protection circuit is formed with a photodiode, and a light-shielding layer covering the photodiode. It is therefore unlikely that photoelectric current would be generated in the first protection circuit, the second protection circuit, and the third protection circuit, and the detection result at the pixel is not affected. Further, as the photodiode and the photoelectric conversion element in the first protection circuit, the second protection circuit, and the third protection circuit have the same structure, the first protection circuit, the second protection circuit, and the third protection circuit can be produced in the step of producing the photoelectric conversion element.

Any one of the second to fifth configurations may be further characterized in further including an insulating film between the photoelectric conversion element and the switching element, wherein the photoelectric conversion element is arranged so as to overlap with the switching element when viewed in a plan view, with the insulating film being interposed therebetween (the sixth configuration).

The sixth configuration makes it possible to enlarge the light receiving surface of the photoelectric conversion element, as compared with a case where the photoelectric conversion element and the switching element are arranged so as not to overlap with each other within the pixel when viewed in a plan view. This makes it possible to improve the quantum efficiency in the photoelectric conversion element.

The fifth or sixth configuration may be further characterized in that each of the first protection circuit, the second protection circuit, and the third protection circuit further includes a switching element for protection circuit, the switching element being connected in series with the photodiode of each of the first protection circuit, the second protection circuit, and the third protection circuit (the seventh configuration).

According to the seventh configuration, in the first protection circuit, the second protection circuit, and the third protection circuit, a switching element for protection circuit is connected in series with the photodiode of each of these protection circuits. Therefore, as compared with a case where no switching element for protection circuit is connected, the first protection circuit, the second protection circuit, and the third protection circuit have greater resistances and capacitances. As a result, even if static electricity flows into each circuit of the first protection circuit, the second protection circuit, and the third protection circuit, rapid voltage change in each circuit is prevented, thereby making it unlikely that the circuit would be broken.

An X-ray imaging panel according to the eighth configuration includes: the active matrix substrate according to any one of the first to seventh configurations; and a scintillator that is provided on a surface on one side of the active matrix substrate, and converts irradiated X-rays into fluorescence (the eighth configuration).

In the eighth configuration, in a case where the first protection circuit is in a reverse-biased state, electric current does not flow through the first protection circuit into the photoelectric conversion element. Besides, when static electricity having a potential higher than the bias voltage flows in from the bias terminal side, the first protection circuit comes into a forward-biased state, but static electricity can be allowed to flow through the first protection circuit into the first line, whereby the photoelectric conversion element can be protected from static electricity.

The eighth configuration may be further characterized in further including: a driving circuit that is connected with the active matrix substrate and scans the gate lines; and a readout circuit that is connected with the active matrix substrate and reads out charges corresponding to fluorescence converted by the scintillator through the data lines (the ninth configuration).

With the ninth configuration, the photoelectric conversion element can be protected from static electricity, and X-ray detection results can be obtained appropriately.

The invention claimed is:

1. An active matrix substrate comprising:
   a gate line;
   a data line that intersects with the gate line;
   a photoelectric conversion element that is provided in a pixel defined by the gate line and the data line;
   a bias line that is connected with the photoelectric conversion element;
   a bias terminal that is connected with the bias line and supplies a bias voltage to the bias line;
   a first line to which a predetermined voltage higher than the bias voltage is supplied; and
   a first protection circuit that is connected in a reverse-biased state between the bias terminal and the first line, and is formed with a nonlinear element.

2. The active matrix substrate according to claim 1, further comprising:
   a switching element that is connected to the gate line, the data line, and the photoelectric conversion element;
   a gate terminal that is connected with the gate line; and
   a pair of second protection circuits that are formed with nonlinear elements and are provided with respect to the gate terminal,
   wherein the gate line is one of a plurality of gate lines,
   wherein the pair of second protection circuits are connected between the gate terminal, commonly, and different ones of a plurality of other gate lines, respectively, and
   each of the pair of second protection circuits is in a forward-biased state when the gate line connected with the gate terminal is in a selected state, and is in a reverse-biased state when the said other gate line connected to the second protection circuit is in a selected state.

3. The active matrix substrate according to claim 2, further comprising:
   a data terminal connected with the data line; and
   a third protection circuit that is formed with a nonlinear element, and is connected with the data terminal,
   wherein the data terminal has a potential higher than a predetermined potential of the first line, and
   the third protection circuit is connected in a reverse-biased state between the data terminal and the first line.

4. The active matrix substrate according to claim 3,
   wherein the photoelectric conversion element is formed with a photodiode, and
   each of the first protection circuit, the second protection circuit, and the third protection circuit includes a photodiode that has the same structure as that of the photoelectric conversion element, and a light-shielding layer that covers the photodiode.

5. The active matrix substrate according to claim 4,
   wherein each of the first protection circuit, the second protection circuit, and the third protection circuit further includes a switching element for protection circuit, the switching element being connected in series with the photodiode of each of the first protection circuit, the second protection circuit, and the third protection circuit.

6. The active matrix substrate according to claim 2, further comprising:
   a data terminal connected with the data line;
   a second line to which a voltage higher than a voltage supplied to the data terminal is supplied; and
   a third protection circuit that is formed with a nonlinear element, and is connected in a reverse-biased state between the data terminal and the second line.

7. The active matrix substrate according to claim 2, further comprising:
   an insulating film between the photoelectric conversion element and the switching element,
   wherein the photoelectric conversion element is arranged so as to overlap with the switching element when viewed in a plan view, with the insulating film being interposed therebetween.

8. An X-ray imaging panel comprising:
   the active matrix substrate according to claim 1; and
   a scintillator that is provided on a surface on one side of the active matrix substrate, and converts irradiated X-rays into fluorescence.

9. The X-ray imaging panel according to claim 8, further comprising:
   a driving circuit that is connected with the active matrix substrate and scans the gate lines; and
   a readout circuit that is connected with the active matrix substrate and reads out charges corresponding to fluorescence converted by the scintillator through the data lines.

* * * * *